(12) United States Patent
Miller et al.

(10) Patent No.: US 12,099,084 B2
(45) Date of Patent: Sep. 24, 2024

(54) SYSTEMS AND METHODS FOR REAL-TIME FAULT DETECTION

(71) Applicant: Maxim Integrated Products, Inc., San Jose, CA (US)

(72) Inventors: Daniel James Miller, Gilbert, AZ (US); Brian A. Miller, Gilbert, AZ (US); Daniel J. Black, Tempe, AZ (US); Daniel David Alexander, Mesa, AZ (US); Hang Fung Yip, Chandler, AZ (US); Jiuhui Wang, Gilbert, AZ (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 142 days.

(21) Appl. No.: 16/384,089

(22) Filed: Apr. 15, 2019

(65) Prior Publication Data

US 2019/0317868 A1  Oct. 17, 2019

Related U.S. Application Data

(60) Provisional application No. 62/658,749, filed on Apr. 17, 2018.

(51) Int. Cl.
*G01R 31/28* (2006.01)
*G01R 31/50* (2020.01)
(Continued)

(52) U.S. Cl.
CPC ......... *G01R 31/2812* (2013.01); *G01R 31/50* (2020.01); *G05B 23/0218* (2013.01); *G06F 11/1629* (2013.01)

(58) Field of Classification Search
CPC ............... G05B 2219/14048; B60L 3/0069
See application file for complete search history.

(56) References Cited

U.S. PATENT DOCUMENTS 4,629,976 A * 12/1986 Pipkorn ............... G01R 19/155
324/133
2001/0005143 A1* 6/2001 Beer .................. G01R 31/2884
324/762.02
(Continued)

FOREIGN PATENT DOCUMENTS

DE           1987907 A1    9/1999
DE      102015006994 A1   12/2015
(Continued)

OTHER PUBLICATIONS

"Wira Adhtama, 3 Easy Definations of Nodes, Branches, and Loops and Examples, Jun. 11, 2021, Wira Electrical, https://wiraelectrical.com/nodes-branches-and-loops/#What_is_a_Loop_in_Electric_Circuit" (Year: 2021).*

(Continued)

*Primary Examiner* — Santosh R Poudel
(74) *Attorney, Agent, or Firm* — North Weber & Baugh; Michael North

(57) ABSTRACT

Described herein are systems and methods for real-time fault detection in electrical circuits. Various embodiments provide a fault detection circuit that uses a resistor network that is controlled to detect an internal current leak in multiple directions, e.g., to ground or to a power supply. The magnitude of the leakage current may be estimated from voltage measurements at voltage pins. In addition, as part of circuit diagnostics, open and short circuit fault conditions may be identified by using current sources and measuring deflections at the voltage pins.

15 Claims, 5 Drawing Sheets

(51) Int. Cl.
*G05B 23/02* (2006.01)
*G06F 11/16* (2006.01)

(56) References Cited

U.S. PATENT DOCUMENTS

| | | | | |
|---|---|---|---|---|
| 2002/0084253 A1* | 7/2002 | Chapman | H01J 37/32935 |
| | | | 438/10 |
| 2008/0106323 A1 | 5/2008 | Aipperspach et al. | |
| 2008/0150483 A1* | 6/2008 | Morita | H02J 9/061 |
| | | | 320/122 |
| 2009/0072809 A1 | 3/2009 | Kaltenegger et al. | |
| 2010/0165526 A1* | 7/2010 | Dishman | H02H 9/026 |
| | | | 361/58 |
| 2010/0259313 A1 | 10/2010 | Li et al. | |
| 2011/0031978 A1* | 2/2011 | Garneyer | H02H 7/0838 |
| | | | 324/537 |
| 2011/0285538 A1* | 11/2011 | Lee | G01R 31/28 |
| | | | 340/636.1 |
| 2012/0217609 A1* | 8/2012 | Tanabe | G01P 15/0897 |
| | | | 438/54 |
| 2012/0303297 A1 | 11/2012 | Alley et al. | |
| 2013/0325303 A1* | 12/2013 | Kiuchi | G01R 31/396 |
| | | | 701/112 |
| 2015/0326065 A1* | 11/2015 | Schaedlich | H02J 7/045 |
| | | | 320/166 |
| 2015/0330116 A1* | 11/2015 | Dente | B60L 58/25 |
| | | | 307/10.1 |
| 2015/0362550 A1 | 12/2015 | Wibben | |
| 2016/0003914 A1* | 1/2016 | Allen | G01R 31/52 |
| | | | 324/523 |
| 2016/0025792 A1 | 1/2016 | Oestreicher | |
| 2016/0025793 A1 | 1/2016 | Oestreicher | |
| 2016/0137079 A1* | 5/2016 | Jefferies | H02H 5/04 |
| | | | 320/109 |
| 2016/0238658 A1 | 8/2016 | Edwards et al. | |
| 2019/0044429 A1* | 2/2019 | Yang | G01R 31/42 |

FOREIGN PATENT DOCUMENTS

| | | |
|---|---|---|
| DE | 102015202597 A1 | 8/2016 |
| WO | 2014102282 A1 | 7/2014 |

OTHER PUBLICATIONS

Response to Chinese office action dated May 9, 2024 in related Chinese patent application No. 201910310459.4, (3 pgs).
Chinese office action mailed Jan. 26, 2024 in related Chinese patent application No. 201910310459.4, (15 pgs).
Notice of allowance mailed Jul. 31, 2024 in related Chinese patent application No. 201910310459.4, (8 pgs).

* cited by examiner

SYSTEMS AND METHODS FOR REAL-TIME FAULT DETECTION

CROSS-REFERENCE TO RELATED APPLICATION

This patent application is related to and claims priority benefit under 35 U.S.C. § 119(e) to and commonly-owned U.S. Provisional Patent Application No. 62/658,749, entitled "SYSTEMS AND METHODS FOR REAL-TIME FAULT DETECTION," naming as inventors Daniel James Miller, Brian A. Miller, Daniel J. Black, Daniel David Alexander, Hang Fung Yip, and Jiuhui Wang, and filed Apr. 17, 2018, which patent document is incorporated by reference herein in its entirety and for all purposes.

A. TECHNICAL FIELD

The present disclosure relates generally to electrical circuits. More particularly, the present disclosure relates to systems and methods for detecting fault conditions in electrical circuits.

B. BACKGROUND

In many safety-critical battery-powered applications, such as in electric vehicles and in the aerospace industry, to ensure proper operation and compliance with safety standards, such as ISO 26060, leakage currents are considered unacceptable and, thus, to be avoided. Ideally, all circuit failures, including open and short circuit conditions, are detected in a timely fashion, such that appropriate countermeasures may be taken. A leakage current that goes undetected, and is thus unaccounted for by a measurement circuit, may interfere with the accuracy of the measurement circuit. For example, a measurement circuit that comprises sensors that rely on current flowing through a negative temperature coefficient (NTC) resistor, i.e., a circuit element having a temperature-dependent electrical resistance, will erroneously attribute a leakage current through the resistor to a false change in temperature. This is exacerbated by the fact that the electrical resistance of an NTC resistor has an inherent, non-zero manufacturing tolerance, such that the added variability makes it difficult to determine the presence of a leakage current in the first place. Conventional approaches that attempt to eliminate current leakage do not involve a measurement of the actual leakage current; instead, they oftentimes employ designs that include cross-point switches and similarly complex circuitry.

Accordingly, what is needed are systems and methods that overcome the shortcoming of existing fault detection approaches.

SUMMARY

Presented are fault detection circuits for determining a circuit failure in multi-channel circuits. General aspects include a fault detection circuit that comprises switches; resistors coupled the switches that are configured to decouple the resistors from a reference potential; and a current source designed to couple to both the resistors and a voltage node, such that measuring the voltage at the voltage node allows to determine the presence of a fault condition. In certain implementations, in response to a fault condition being detected, an alarm may be trigged.

Implementations may further include one or more of the following features. A voltage at the voltage node being relatively smaller than the reference potential may indicate an open circuit condition in the fault detection circuit. A voltage at or near a ground potential may indicate an open circuit condition in a resistor network that includes a plurality of voltage nodes. At least one of the resistors may be a thermistor that may be a negative temperature coefficient resistor. The fault detection circuit may further comprise a second resistor that shares a common voltage node with the thermistor, the second resistor and the thermistor being coupled to ground during a diagnostic measurement.

One general aspect comprises a method for using a fault detection circuit for real-time fault detection, the method comprising: disconnecting resistors from a reference potential; coupling a current source to the resistors and a voltage node; measuring the voltage at the voltage node; and based on the voltage measurement, determining the presence of a fault condition.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF EMBODIMENTS

Figure 1:
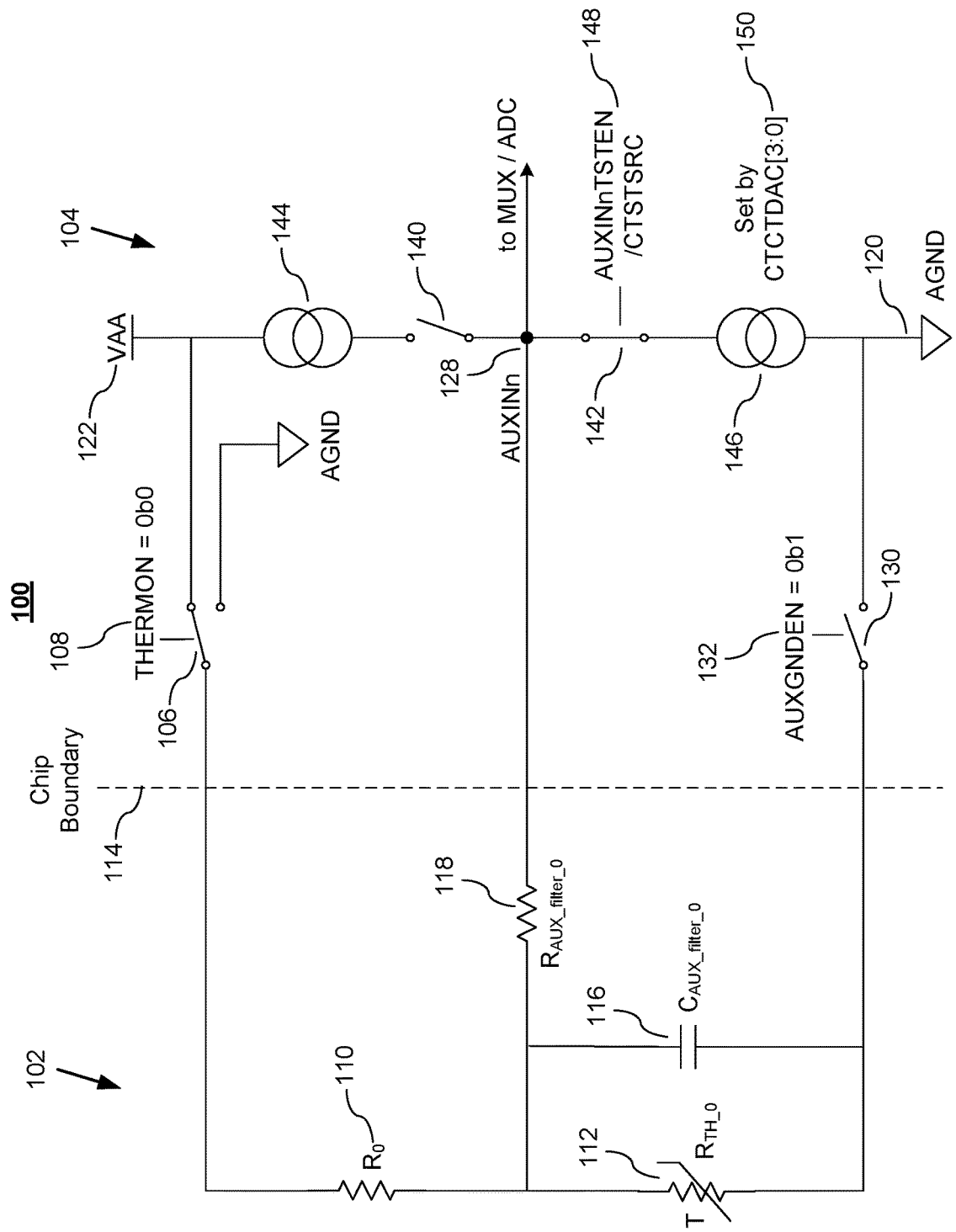
FIG. 1 illustrates an exemplary single-channel circuit for determining circuit failure, according to embodiments of the present disclosure.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated. Furthermore, the use of memory, database, information base, data store, tables, hardware, and the like may be used herein to refer to system component or components into which information may be entered or otherwise recorded.

Furthermore, it shall be noted that: (1) certain steps may optionally be performed; (2) steps may not be limited to the specific order set forth herein; (3) certain steps may be performed in different orders; and (4) certain steps may be done concurrently.

FIG. 1 illustrates an exemplary single-channel circuit for determining circuit failure, such as a current leakage or an open or short circuit condition, according to embodiments of the present disclosure. Circuit 100 comprises resistor network 102 that, in turn, may comprise resistors 110, 112, 118 and capacitor 116, on-chip components 104 may comprise current sources 144, 146, switches 106, 130, 140, and 142 voltage node 128 (labeled AUXINn in FIG. 1), and analog ground 120.

It is understood that although resistor network 102 is depicted as being not on a chip, i.e., separated from on-chip components 104 at chip boundary 114, this is not intended as a limitation on the scope of the present invention as any component of resistor network 102 may be embedded on-chip. For example, resistor $R_O$ 110 may be implemented internal to a chip that comprises components 104. It is further understood that resistor network 102 may comprise any number of sub-networks that may each be associated with a different channel on the chip (note that only a single channel is shown in FIG. 1), such that any number of channels may be implemented on a die comprising some or all of circuit 100.

In embodiments, the combination of resistor 118 and capacitor 116 may form an auxiliary filter. Resistor 112 may be implemented as a thermistor, e.g., a negative temperature coefficient (NTC) resistor that together with pull-up resistor $R_O$ 110 (e.g., a 10 kΩ resistor) forms a resistive divider. In embodiments, current source 144 is a pull-up current source, and current source 146 is a pull-down current source. In embodiments, switches 106, 130, 140, and 142 may be programmable and controllable by digital circuitry. For example, as depicted in FIG. 1, switch 106 may be controlled by a control signal, such as enable signal 108 (labeled THERMON), switch 130 may be controlled by enable signal 132 (labeled AUXGNDEN), and switch 142 may be controlled by enable signal 148 (labeled AUXINnTSTEN).

Circuit 100 may be powered by an internal or external power supply (e.g., 122). It is noted that any number of voltage nodes in circuit 100 may be made accessible at pin that are accessible by internal or external circuits. For example, in embodiments, node 128 is an auxiliary pin that may be coupled to a multiplexer, a comparator (e.g., a programmable-threshold comparator), and/or an analog-to-digital converter (ADC) (not shown in FIG. 1).

Signal CTSTSRC 148 represents a polarity bit that indicates which current source 144, 146 is to be activated. For example, if CTSTSRC signal 148 is set to a low state, then pull-down current source 146 is enabled and pull-up current source 144 is disabled. Conversely, if CTSTSRC signal 148 is set to high, then pull-up current source 144 is enabled and pull-down current source 146 is disabled. In embodiments, signal CTSTSRC 148 may be a signal that is shared, e.g., with cell test current sources. Signal CTSTDAC[3:0] 150 may be a register that determines the magnitude of current source 146.

In embodiments, signal AUXINnTSTEN 148 may be a multi-bit signal that independently turns on and off each pull-down current source (e.g., 146) or pull-up current source, depending on value of polarity bit CTSTSRC 148, through a register bit whose values may be set or programmed prior to operation of circuit 100. In embodiments, signal AUXINnTSTEN 148 enables or disables switch 142 (or switch 140, depending on value of polarity bit CTSTSRC 148) for a channel, such that, for example, only even numbered channels or odd numbered channels are active at a given time. In embodiments, the enable signal for each channel may be tied to any combinatory logic, e.g., to implement enabling and disabling of various channels at a time.

In operation, an output voltage of circuit 100 may be measured at pin 128, e.g., by an ADC or comparator circuit that may have a programmable or fixed threshold that may trigger an alert, e.g., to notify a host device. In embodiments, the host may use the ADC to measure voltages for a channel that comprises pin 128 to determine whether the voltage at that channel is at or near a ground potential AGND 120, thus, indicating the presence of an open circuit condition in resistor network 102, as will be discussed next.

In embodiments, in a regular operation mode, switch 106 may be coupled to supply voltage 122 and, in a diagnostic mode, to analog ground 120. Similarly, thermistor 112 may be coupled to analog ground 120 via switch 130, which, in embodiments, may be internally opened for diagnostic purposes. In embodiments, in normal operation, the resistive divider formed by pull-up resistor $R_O$ 110 and thermistor 112 carries a current that depends on temperature. As a result, each individual pin 128 associated with a channel may be at a different voltage.

In embodiments, in a diagnostic mode, in order to allow circuit 100 to detect the presence of a fault condition, such as an open circuit in resistor network 102, switch 106 is controlled to couple to supply voltage 122, while thermistor 112 may be disconnected from ground 120, e.g., by controlling enable signal 132 to be low, such as to put switch 130 in an open state. Once switch 130 is open, thermistor 112, capacitor 116, and also node 128 are disconnected from ground 120, and, thus, may be pulled high to supply voltage 122 via pull-up resistor $R_O$ 110 that will typically assume a voltage that is determined by the voltage on switch/pin 106, here, supply voltage VAA 122.

Once current source 146 is connected via switch 142, the expected output voltage of circuit 100 at pin 128 would be supply voltage VAA 122 minus any current flowing through current source 146 multiplied the resistance of the path comprising resistors 110 and 118. In other words, the expected voltage on pin 128 will assume some value below supply voltage VAA 122 that, in this embodiment, serves as the reference voltage for pin 128.

However, if, while current source 146 is enabled, circuit 100 experiences an open circuit failure, such that pin 128 is no longer electrically connected to, e.g., resistor network 102 or some external device that is connected to resistor network 102, such as electrical components left of chip boundary 114, then there would be no component left in circuit 100 that could pull pin 128 up to VAA 122. As a result, pin 128 would assume a near 0 V value, e.g., equal to analog ground 120. Advantageously, this circumstance that has been caused by and indicates an open circuit condition in circuit 100 may be easily detected as a voltage on pin 128 that is relatively lower than supply voltage VAA 122. Similarly, for embodiments using multi-channel operation, the voltages for each channel that has its own pin 128 may be measured to determine whether the voltage at any one of the channels is at or near a ground potential AGND 120 in order to determine whether an open circuit condition exists in resistor network 102.

As will be discussed in greater detail, with reference to FIG. 3, in embodiments, circuit 100 in FIG. 1 may be configured to operate using analog ground 120 as a reference voltage for pin 128 instead of supply voltage VAA 122, in effect, flipping circuit operation upside-down. In embodiments, referencing to ground is accomplished by configuring switch 106 to connect to AGND 120 and/or closing switch 130. A pull-up configuration is implemented by opening switch 142 and closing switch 140. In embodiments, pull-up current source 144 may be used to cause the voltage on pin 128 to assume the value of supply voltage 122 in the presence of an open fault condition.

As with the operation of circuit 100 for detecting open conditions, circuit 100 may be enabled to detect the presence of a fault condition that comprises an electrical short between adjacent pins 128 in a multi-channel embodiment. To accomplish this, in embodiments, signal 108 may be controlled to couple switch 106 to supply voltage 122 and switch/pin 130 may be opened, e.g., via enable signal 132, to allow pin 130 to be disconnected from ground 120. As a result, thermistors 112 and pin 128 will also be disconnected from ground 120 and pins 128 will assume supply voltage 122.

In embodiments, to identify whether there is a short between adjacent pins, such that there is a possibility of current flowing to adjacent channels e.g., through resistor network 102, once one of pins 128 has no connection to ground 120. In embodiments, every other current source 146, e.g., current sources 146 coupled to even-numbered channels, are enabled, such that the voltage at those channels and, to some extent at other channels, is pulled down. As a result, the voltages at pins 128 will be deflected away from supply voltage 122, and pins 128 that are, e.g., coupled to even-numbered channels will assume relatively lower voltages than those that are coupled to odd-numbered channels or sub-circuits, in effect, exhibiting alternating values.

However, if pin 128 is adjacent to a pin that is electrically shorted, instead of having alternating values, these two adjacent pins will assume a similar value that will be measurably different from other pins next to the two adjacent pins.

The value between adjacent pins that are shorted will be the same only with a very low impedance short. While parasitic and undesired impedances of hundreds of ohms may result in differing values for adjacent pins, the voltage at a pin that is not coupled to an active current source will still be deflected due to the parasitic impedance path.

Advantageously, the difference between the value(s) for the two adjacent pins and other pins may be detected and used as an indicator of an electrical short in one of the channels of circuit 100. In addition, the electrical short not only indicates a near zero impedance, but also an undesired impedance between adjacent pins 128.

It is noted that because the exact value of thermistor(s) 112 may be unknown, it is difficult to know how large of a voltage deflection will occur in a fault scenario in this embodiment. In addition, any amount of deflection will depend on the coupling between channels and the voltage at switch 130 that is electrically open. However, bounds may be placed on the expected values of thermistor(s) 112 such that a predetermined threshold may be used to identify an electrical short condition.

In embodiments, a sequencer (not shown in FIG. 1) that processes the inputs to an ADC may be used to initiate measurements on different channels/pins 128, e.g., via a routine that steps through a series of measurements of different pin voltages, e.g., by measuring each pin 128 in a given order. In embodiments, the sequencer may instruct a multiplexer (also not shown in FIG. 1) coupled to the ADC (or comparator) on which type of measurements to take by controlling the connections to the ADC. In addition, by observing the behavior of circuit 100, a faulty operation of a defective sequencer itself may be discovered, thus, further increasing system reliability.

In embodiments, FIG. 1 may also perform a diagnostic to detect a current leakage, as will be discussed in greater detail with reference to FIG. 2. Those embodiments assume that current sources 144 and 146 in FIG. 1 are inactive.

Figure 2:
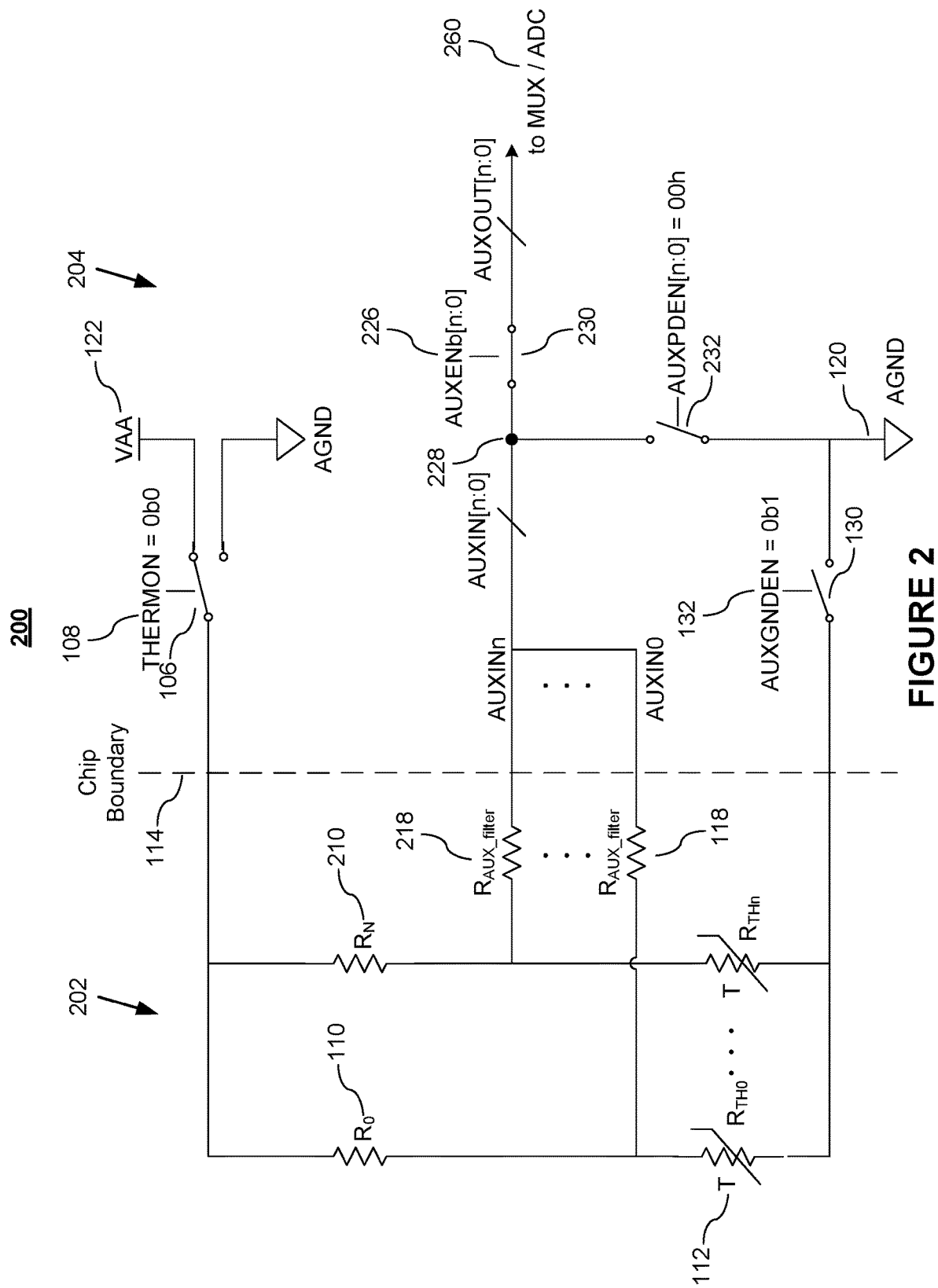
FIG. 2 illustrates an exemplary multi-channel circuit for determining circuit failure according to embodiments of the present disclosure.

FIG. 2 illustrates an exemplary multi-channel circuit for determining circuit failure according to embodiments of the present disclosure. For clarity, components similar to those shown in FIG. 1 are labeled in the same manner. For purposes of brevity, a description or their function is not repeated here. Circuit 200 is depicted with several channels that each is associated with a resistor network. As in FIG. 1, resistor networks in FIG. 2 may comprise resistors (e.g., 110 and 210) that may comprise thermistor (e.g., 112, 212) and filter resistors (e.g., 118, 218). In embodiments, each channel has a dedicated output pin 228.

It is understood that rather than reading out voltages and analyzing results externally, in embodiments, data may be analyzed directly on-chip. It is further understood that circuit 200 may comprise additional components not shown in FIG. 2, such as filter capacitors that may be used to control settling times and other or additional elements that aid in accomplishing the goals of the present disclosure.

In embodiments, pull-down enable switch AUXPDEN 232 may be used to discharge a filter capacitance and implemented as a register that is programmable, e.g., depending on a diagnostic mode. In embodiments, switch 230 is a multi-function pin that is controlled by AUXEN signal 226 that represents a register value coupled to switch 230. To allow for alternate functions on a same pin 228, AUXEN signal 226 may be programmed to assume high or low state, e.g., by pushing an input into a register. In embodiments, AUXEN signal 226 is an enable signal for the AUX channel that by closing switch 230 enables a current path to, e.g., an ADC or multiplexer 260. This may be implemented by using a bit that determines whether to use pin 228 as an AUX pin that provides a voltage that can be analyzed, or as a general purpose input-output switch.

As with the operation of circuit 100 in FIG. 1 for detecting open and short circuit conditions, circuit 200 in FIG. 2 may be used to detect fault conditions between adjacent pins 228. For purposes of brevity, a description or the applicable functions is not repeated here. It is noted that while no current sources are depicted in FIG. 2, circuit 200 may utilize any number of current sources to accomplish the goals of the present disclosure.

In embodiments, assuming that switches AUXGNDEN 130 are open, switch 106 is enabled, such that pull-up resistor 110 is coupled to supply voltage 122, and no fault is present in circuit 100, the voltages measured at voltage node 128 in circuit 200 are expected to assume supply voltage 122, thus, providing voltage VAA 122 to each individual AUX channel.

Conversely, if a fault is present, e.g., an internal current leak to ground through a damaged device, the pins at node/pin 128 in circuit 100 are expected to assume some voltage that is less than supply voltage VAA 122, e.g., by some value. In the absence of very high thermistor 112 values, once a leak to ground is present at one of the pins 128, since the resistor network in circuit 100 is coupled to all channels, the voltage on each of pins 128 may move relatively lower due to a (typically unintended) current split, e.g., through a damaged device, such as an ESD structure, an overvoltage condition on the board, or any similar situation that may cause a current leak in circuit 200. In embodiments, the channel that is associated with the leakage may then be identified as the one having the relative lowest voltage value.

In this embodiment, where there are no active current sources, switch 130 is open, and switch 106 is coupled to VAA 122, if an internal leakage to VAA 122 were present in circuit 200, then there would be no voltage difference between the leakage source and, e.g., a voltage that may be externally applied to resistor network 202. Therefore, in embodiments, to enable the detection of a current leak to power supply 122, the voltages at pins 128 are pulled toward ground 120, e.g., by connecting switch 106 to ground, while leaving switch 130 open, such that the voltages of resistors 110, 112, 118, 218, which are not connected to ground 120, may interact with each other. In embodiments, if no leakage is present, all channels, i.e., 228 will go to ground. Conversely, if there is a current leak to supply 122, the voltage at pin 128 that is associated with the leak will assume a value that is higher than ground potential by some threshold, i.e., the channel with leakage will have the highest value among the channels. Note that this scenario is the inverse of the above case.

In embodiments, the magnitude of the leakage current may be estimated from voltage measurements at pins 128. In embodiments, to identify the magnitude of an error, the values of the channels may be compared to each other to determine how much lower each voltage at pin 228 is, e.g., when compared to some threshold value. This may provide a better indicator of the current leakage/magnitude of error than a comparison to supply voltage 122.

It is understood that various embodiments may be combined and, e.g., in order to improve efficiency, different circuit diagnostics may be simultaneously performed using different conditions. For example, different thresholds may be used for different channels. In embodiments, every other current source may be activated to diagnose an open circuit condition on those channels with active current sources, while short circuit and leakage conditions are performed on channels with no active current sources.

Figure 3:
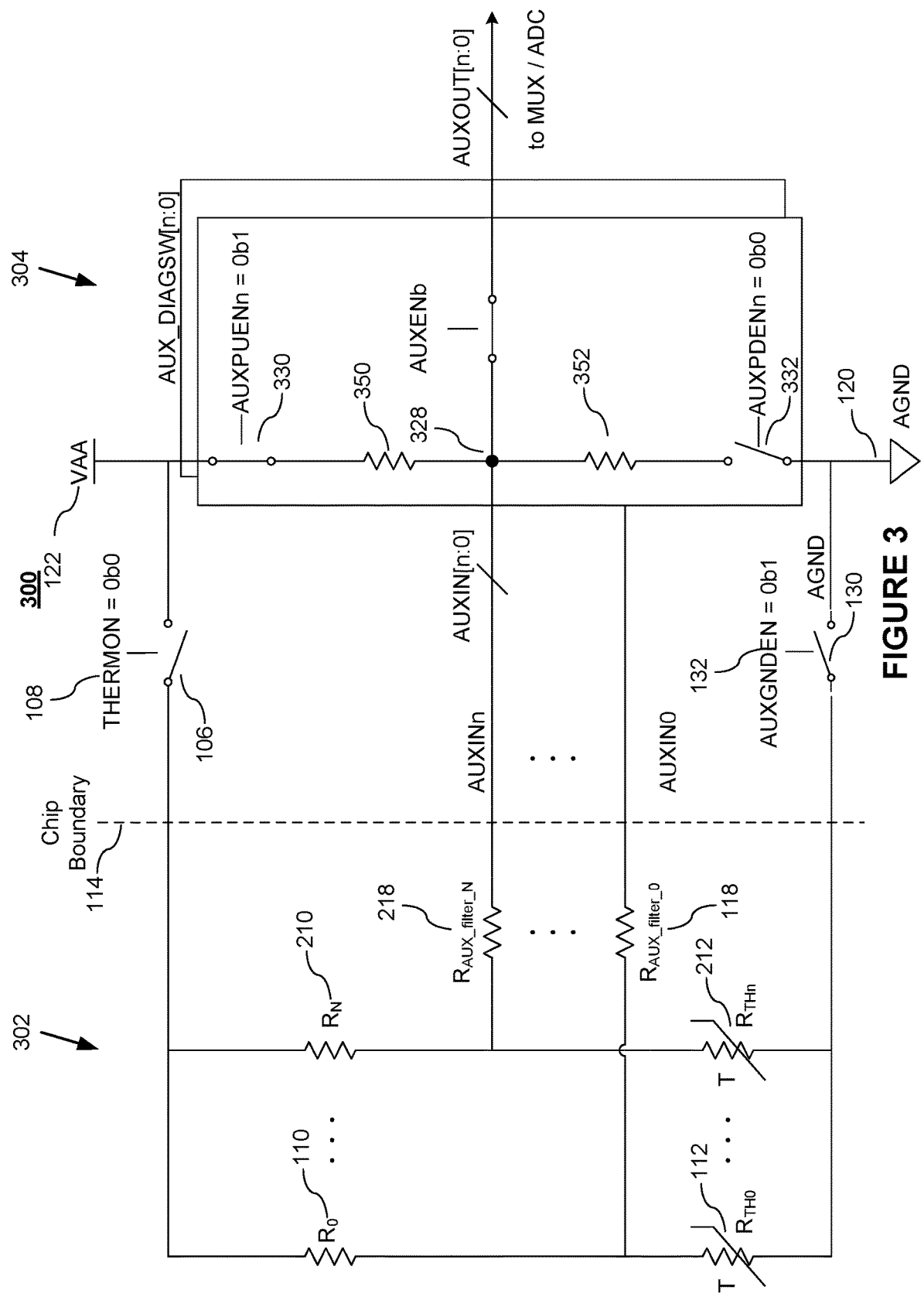
FIG. 3 illustrates an alternate leakage detection using an exemplary multi-channel circuit comprising internal resistors according to embodiments of the present disclosure.

FIG. 3 illustrates an alternate leakage detection using an exemplary multi-channel circuit comprising internal resistors according to embodiments of the present disclosure. Same numerals as those shown in FIG. 2 denote similar elements and, as with the current leakage diagnostic discussed with reference to FIG. 2, embodiments in FIG. 3 assume that no current sources are activated.

The operation of circuit 300 is similar to those previously described with reference to the current leakage diagnostic in FIG. 1 and FIG. 2 with the difference that internal resistors 150, 152 are used as a reference for pin 128.

In embodiments, circuit 300 may be configured to detect a current leak to ground 120. In embodiments, this is accomplished, by opening switches 106, 130, and AUXPDEN (AUX pull-down enable) 332 and closing switch 330, such that a leakage current to ground 120 may be measured, e.g., at pin 328, as a negative voltage deflection away from supply voltage VAA 122.

Conversely, circuit 300 may be configured to detect a current leak to supply VAA 122, by opening switches 106, 130, and AUXPUEN 330 (AUX pull-up enable) and closing switch 332, such that a leakage current to supply VAA 122 may be measured, at pin 328, as a positive voltage deflection from AGND 120. It is understood that both switches AUXPDEN 332 and AUXPUEN 330 may be implemented as programmable registers.

Figure 4:
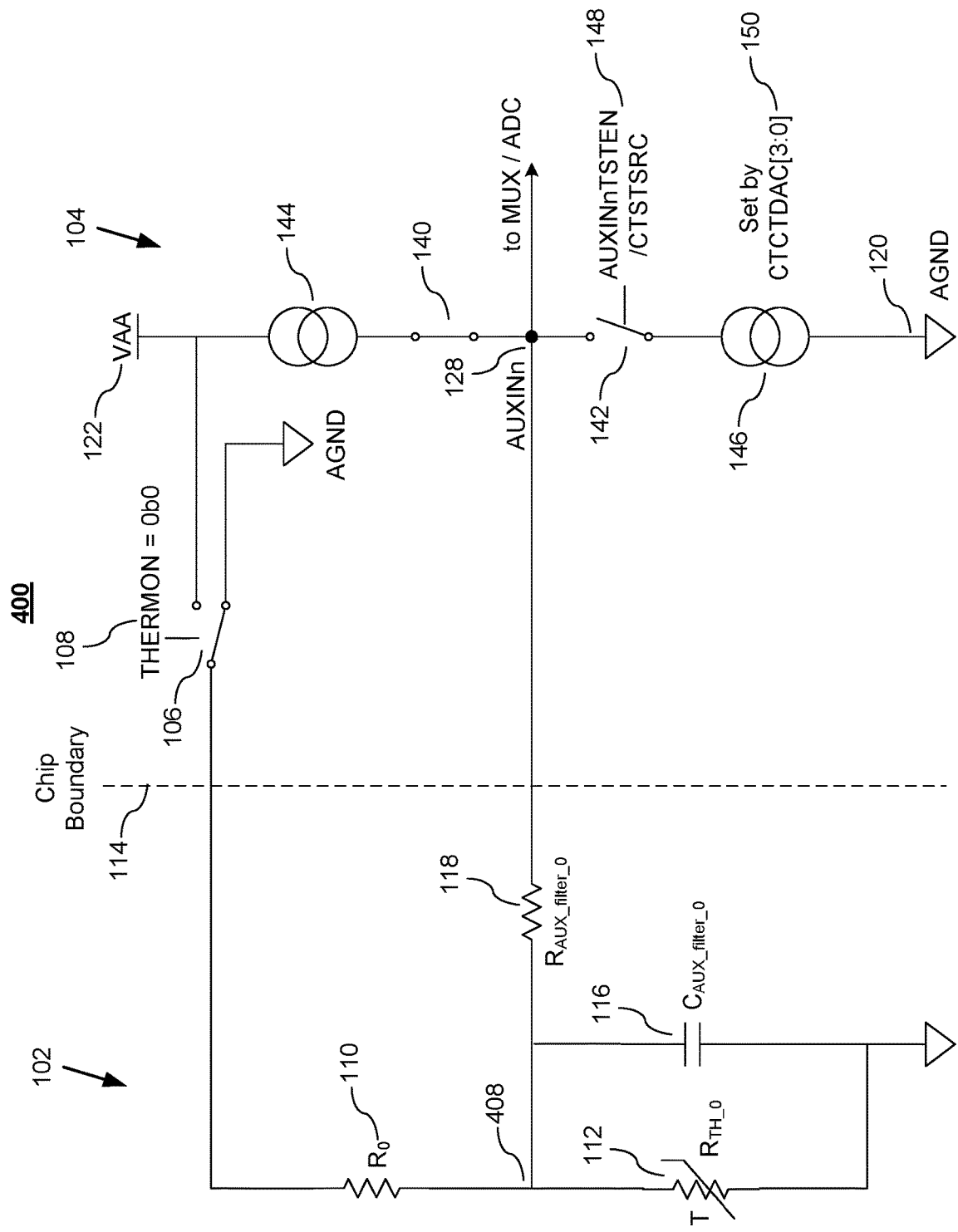
FIG. 4 illustrates an exemplary circuit for determining circuit failure utilizing a grounded resistor according to embodiments of the present disclosure.

FIG. 4 illustrates an exemplary circuit for determining circuit failure utilizing a grounded resistor according to embodiments of the present disclosure. As depicted in FIG. 4, resistor 112 (e.g., an NTC resistor) may be disconnected from analog ground 120. Resistor $R_0$ 110 is coupled to analog ground 120 via switch 106. In embodiments, for short and open circuit diagnostics, pull-up current source 144 may cause a deflection of voltage node(s) 128 from ground reference 120. It is noted that this is similar to the inverted case previously discussed with reference to FIG. 2.

If no current flows through current source 144 in FIG. 4, pin 128 will assume a ground potential. In embodiments, if switch 140 is open such that current course 144 is turned off, a current leak to virtually anywhere within circuit 400 (other than to ground, i.e., the reference itself) may be detected by measuring whether the voltage at node 128 moves away from ground potential. This is due to the fact that a current leak out of node 128 would raise the voltage to a value that is above the level of analog ground.

In other words, once current sources 144, 146 are turned off during a current leakage diagnostic, a leakage may be inferred from the fact that a non-zero voltage can be measured voltage at pin 128. It is noted that this embodiment captures scenarios in which, at pin 128, a voltage with respect to ground may be captured, i.e., in one direction.

In embodiments, if switch 140 is closed, switch 142 is open, and switch 106 remains coupled to ground 120, i.e., with resistor 112 referenced to ground 120 and circuit 400 being referenced to ground 120, resistor 110 will be connected in a parallel configuration with resistor 112, thus, limiting the range of possible values that the parallel combination may assume. For example, if resistor 112 is an NTC resistor that operates in at elevated temperatures, i.e., at some value near 0'Ω, then voltage at node 408 between resistor 110 and resistor 112 becomes close to the ground voltage, such that a voltage drop can develop mainly across filter resistance 118.

Conversely, if resistor 112 operates at relatively low temperatures, such that it has a relatively high resistance, then resistor 112 will be in parallel with filter resistor 110, such that that the combination of 118, 112, and 110 cannot exceed the summed resistances of resistors 110 and 118. Unlike embodiments in FIG. 1 that utilize a resistor 112, such that current may flow to neighboring channels, circuit 400 in FIG. 4 has the advantage that resistor 112 has a fixed reference, here, ground 120. As a result, interactions between channels/pins are virtually not existent, thus, providing a better defined circuit condition.

In embodiments, to enable leakage measurements in more than one direction, a low-side dual throw switch that is similar to high-side switch 106 may be added to circuit 400, e.g., at the grounded end of resistor 112. This allows resistor 112 to be selectively tied to VAA 122 or ground 120. One of skill in the art will appreciate that this embodiment may function as an inversion of the circuit 100 shown in FIG. 1 such that circuit 100 can be referenced to VAA 122 and while suppressing interactions between adjacent pins 128.

Figure 5:
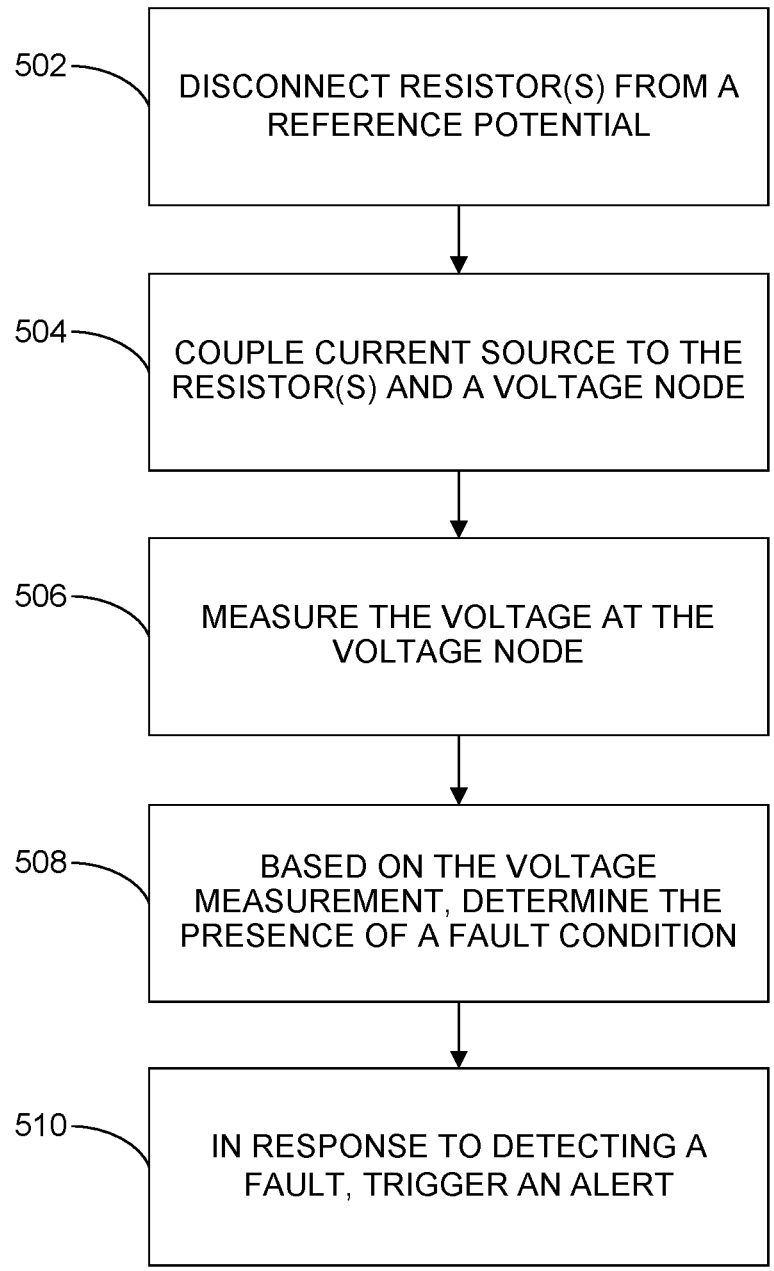
FIG. 5 is a flowchart for using a fault detection circuit to determine a circuit failure according to embodiments of the present disclosure.

FIG. 5 is a flowchart for using a fault detection circuit to determine a circuit failure according to embodiments of the present disclosure. Process 500 begins at step 502 when, in a circuit, a number of resistors that may be internal or external to a fault detection circuit are disconnected, e.g., via a digital switch, from a reference potential, such as ground potential or a power supply voltage. In embodiments, one or more switches are opened, e.g., via an enable signal, such as to decouple, from the fault detection circuit, one end of a thermistor (e.g., an NTC resistor) that, at the other end, is coupled to a voltage node. It is noted that, in embodiments, two resistors sharing a common voltage node may be both coupled to ground to perform certain diagnostics.

At step 504, one or more current sources, e.g., every other current source in the fault detection circuit that is coupled to the other end of the thermistor(s), are coupled to a voltage node to sequentially measure one or more voltages, at step 506, e.g., after a predetermined settling time and by using a voltage measurement circuit, such as an ADC or a comparator circuit. It is noted that, in embodiments, current sources may be required for short and open diagnostics, and not for leakage diagnostics.

At step 508, based on the measurement of one or more channels that may be recorded, it is determined, via on-chip or off-chip analysis, whether a fault condition, such as a short between adjacent voltage nodes or a current leak exists, e.g., by comparing voltages measured in adjacent sub-circuits.

Finally, at step 510, in response to a fault being detected an alarm may be triggered, e.g., to a host device that is coupled to the circuit. In embodiments, the host may use a sequencer that via the ADC measures a voltage at voltage node that is referenced to a potential in the circuit.

Overall, for any number of networks or channels, a measurement of a voltage at an auxiliary pin(s) may be used to detect the presence of a circuit failure in the resistor network.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A fault detection circuit for determining a circuit failure in a multi-channel circuit, the fault detection circuit comprising:
multiple switches comprising a first switch, a second switch, a third switch, and a fourth switch;
multiple resistors that form a resistor network, the first switch is configured to electrically couple at least one of the one or more resistors to a reference potential, the second switch is configured to electrically disconnect part of the one or more resistors from a ground; and
a pull-down current source that, upon being coupled by the fourth switch to a voltage node, causes the voltage node to be at an expected voltage below the reference potential by a value when no fault is present and when the third switch is configured to disable a pull-up current source between the reference potential and the voltage node, the value is a multiplication between a current through the pull-down current source and a resistance of a current path in the resistor network between the reference potential and the voltage node, wherein, a deflection away from the expected voltage at the voltage node indicates a fault condition.

2. The fault detection circuit according to claim 1, wherein the voltage at the voltage node being relatively smaller than that of an adjacent voltage node that is releasably coupled to the reference potential indicates a short circuit condition between the voltage node and the adjacent voltage node.

3. The fault detection circuit according to claim 1, wherein the voltage at the voltage node being at or near a ground potential indicates an open circuit condition in a resistor network in the multi-channel circuit.

4. The fault detection circuit according to claim 1, wherein at least one of the one or more resistors is a thermistor.

5. The fault detection circuit according to claim 4, wherein the thermistor is a negative temperature coefficient resistor.

6. The fault detection circuit according to claim 5, wherein the one or more resistors further comprise a second resistor that shares a common voltage node with the thermistor, the second resistor and the thermistor being coupled to ground during a diagnostic measurement.

7. The fault detection circuit according to according to claim 1, wherein two voltage nodes in adjacent sub-circuits exhibiting values that are closer to each other than to values of other voltage nodes indicates that at least one of the two voltage nodes is electrically shorted.

8. A method using a fault detection circuit for real-time fault detection, the method comprising:
electrically coupling, by switching on a first switch, at least part of a resistor network comprising multiple resistors to a reference potential;
electrically disconnecting, by switching off a second switch, at least part of the resistor network from a ground;
electrically disconnecting, by switching off a third switch, a path from a voltage node to the reference potential via a pull-up current source;

while the third switch is switched off, coupling, by switching on a fourth switch, a pull-down current source to the voltage node;

quantitatively measuring a voltage at the voltage node the voltage has an expected voltage below the reference potential by a value when no fault is present, the value is a multiplication between a current through the pull-down current source and a resistance of a current path in the resistor network between the reference potential and the voltage node; and in response to determining that the voltage at the voltage node is a deflection away from the expected voltage, determining that a fault condition is present.

9. The method according to claim 8, wherein a voltage at the voltage node being relatively smaller than that of an adjacent voltage node that is releasably coupled to the reference potential indicates a short circuit condition between the voltage node and the adjacent voltage node.

10. The method according to claim 9, wherein the voltage at the voltage node being at or near a ground potential indicates an open circuit condition in the resistor network in the multi-channel circuit.

11. The method according to claim 10, wherein the resistor network comprises at least one negative temperature coefficient resistor.

12. The method according to according to claim 8, comprising, in response to lowering the voltages at every other voltage node by connecting every other current source, using the presence of (1) a first difference between two voltages at two voltage nodes in adjacent sub-circuits and (2) a second difference between one of the two voltage nodes and another voltage node as an indication that at least one of the two voltage nodes is electrically shorted.

13. The method according to claim 12, wherein the second difference is defined by a predetermined threshold.

14. The method according to claim 8, wherein the reference potential is a power supply voltage.

15. The method according to claim 8, further comprising, in response to the fault condition being detected, triggering an alarm.

* * * * *